(12) United States Patent
Chen et al.

(10) Patent No.: US 7,199,055 B2
(45) Date of Patent: Apr. 3, 2007

(54) MAGNETIC MEMORY CELL JUNCTION AND METHOD FOR FORMING A MAGNETIC MEMORY CELL JUNCTION

(75) Inventors: Eugene Y. Chen, Fremont, CA (US); Kamel Ounadjela, Belmont, CA (US); Witold Kula, Cupertino, CA (US); Jerome S. Wolfman, Tours (FR)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/786,440

(22) Filed: Feb. 25, 2004

(65) Prior Publication Data

US 2004/0175848 A1    Sep. 9, 2004

Related U.S. Application Data

(60) Provisional application No. 60/451,483, filed on Mar. 3, 2003.

(51) Int. Cl.
*H01L 21/302* (2006.01)
*H01L 21/461* (2006.01)

(52) U.S. Cl. ..................... 438/690; 438/734

(58) Field of Classification Search ............... 365/171, 365/173; 438/3, 689, 690, 734
See application file for complete search history.

(56) References Cited

U.S. PATENT DOCUMENTS

| | | | |
|---|---|---|---|
| 4,047,975 A * | 9/1977 | Widmann | 438/348 |
| 6,024,885 A | 2/2000 | Resnick et al. | |
| 6,165,803 A | 12/2000 | Chen et al. | |
| 6,275,411 B1 * | 8/2001 | Daughton et al. | 365/158 |
| 6,365,419 B1 | 4/2002 | Durlam et al. | |
| 6,383,574 B1 | 5/2002 | Chen et al. | |
| 6,534,223 B1 * | 3/2003 | Yang | 430/5 |

(Continued)

FOREIGN PATENT DOCUMENTS

EP    1 187 103    3/2002

(Continued)

OTHER PUBLICATIONS

International Search Report, application No. PCT/US2004/006149, mailed Sep. 29, 2004.

*Primary Examiner*—Ngân V. Ngô
(74) *Attorney, Agent, or Firm*—Mollie E. Lettang; Kevin L. Daffer; Daffer McDaniel, LLP

(57) ABSTRACT

A method for patterning a magnetic memory cell junction is provided herein, which includes etching exposed portions of a stack of layers to a level spaced above a tunneling barrier layer of the stack of layers. In addition, the method may include implanting dopants into exposed portions of the stack of layers. For example, the method may include oxidizing and/or nitriding the exposed portions of the stack of layers. In some embodiments, the steps of etching and implanting dopants may form an upper portion of the magnetic cell junction. Alternatively, the method may include alternating the steps of etching and implanting dopants throughout the thickness of the exposed portions of the stack of layers. In either case, the stack of layers may include a magnetic layer which includes a material adapted to prevent the introduction of dopants underlying the tunneling barrier layer during the step of implanting.

20 Claims, 5 Drawing Sheets

U.S. PATENT DOCUMENTS

| | | |
|---|---|---|
| 6,759,263 B2 | 7/2004 | Ying et al. |
| 2001/0031374 A1 | 10/2001 | Chang et al. |
| 2001/0040778 A1 | 11/2001 | Abraham et al. |
| 2002/0132375 A1 | 9/2002 | Keller et al. |
| 2002/0142192 A1 | 10/2002 | Hieda et al. |
| 2003/0175997 A1* | 9/2003 | Kyler et al. .................. 438/3 |

FOREIGN PATENT DOCUMENTS

| | | |
|---|---|---|
| EP | 1 251 570 | 10/2002 |
| EP | 1 163 676 | 12/2002 |
| JP | 63-4621 A * | 1/1988 |

* cited by examiner

MAGNETIC MEMORY CELL JUNCTION AND METHOD FOR FORMING A MAGNETIC MEMORY CELL JUNCTION

PRIORITY APPLICATION

This application claims priority to provisional application No. 60/451,483 entitled "Magnetic Memory Cell Junction and Method for Forming a Magnetic Memory Cell Junction," filed Mar. 3, 2003.

BACKGROUND OF THE INVENTION

1. Field of the Invention

This invention relates to semiconductor device manufacturing, and more particularly, to a method for etching a semiconductor topography.

2. Description of the Related Art

The following descriptions and examples are not admitted to be prior art by virtue of their inclusion within this section.

Recently, advancements in the use of magnetoresistive materials have progressed the development of magnetic random access memory (MRAM) devices to function as viable non-volatile memory circuits. In general, MRAM circuits exploit the electromagnetic properties of magnetoresistive materials to set and maintain information stored within individual magnetic memory cell junctions of the circuit. In particular, MRAM circuits utilize magnetization direction to store information within a memory cell junction, and differential resistance measurements to read information from the memory cell junction. More specifically, information is stored within an MRAM cell junction as a bit, the state of which is indicated by the direction of magnetization within one magnetic layer of the memory cell relative to another magnetic layer of the memory cell. In addition, a differential resistance can be determined from differences in the magnetization directions between magnetic layers of the memory cell such that the state of the bit stored in the MRAM cell junction may be read.

Such adaptations of the MRAM cell junction may include one or more magnetic layers having a fixed magnetic direction and one or more other magnetic layers which do not have a fixed magnetic direction. In particular, the magnetic layers within the magnetic cell junction which do not have a fixed magnetic direction may be adapted to change their magnetic direction relative to the magnetic layers having a fixed magnetic direction such that logic states of a bit may be stored. Consequently, the portion of the magnetic cell junction having the layers with a fixed magnetic direction may be referred to as the "reference portion," while the portion of the magnetic cell junction having the one or more magnetic layers adaptable to change may be referred to as the "storage portion."

Typically, a magnetic cell junction is formed from patterning a stack of layers such that a structure of a given length and width may be obtained. In some cases, such a patterning process may include wet etching the stack of layers. Such a technique, however, may cause some portions of the stack of layers to be undercut. Consequently, the dimensions of magnetic cell junctions formed from wet etch techniques may vary within an array. In general, variations of cell junction sizes and shapes may cause the amount of current needed to switch the magnetic direction of memory cells to vary, reducing the reliability of the memory array. In particular, size and shape variations of the cell junctions within an array may allow a false bit to be unintentionally written to one or more cells. As such, in an effort to alleviate the undercut problem, dry etch techniques, such as ion milling and reactive ion etching are sometimes employed to pattern magnetic cell junctions. Such dry etch techniques, however, often cause material removed from the stack of layers to be redeposited upon sidewalls of the patterned magnetic cell junctions. In some cases, such a redeposition of material may alter the functionality of the memory array or render the memory array inoperable. In particular, the redeposition of material along the sidewalls of a magnetic cell junction may produce shorts across the tunneling barrier layer of the cell junction, prohibiting the logic state of the magnetic cell junction from being determined.

Consequently, in some embodiments, another technique is employed to define the lateral boundaries of magnetic cell junctions within a memory array. More specifically, in some cases, exposed portions of a stack of layers having a masking layer formed thereupon may be oxidized such that unoxidized portions of the stack of layers underlying the masking layer may define the lateral boundaries of the magnetic cell junction or more particularly, the lateral boundaries of the storage portion of the magnetic cell junction. Such a technique often requires a relatively robust oxidation process, such as a high density plasma oxidation process, in order to oxidize the thickness of the layers within the storage portion of the stack of layers. Controlling the depth of oxidation using a robust oxidation process, however, is often difficult. Consequently, lower layers of the stack of layers may be undesirably oxidized. In particular, layers arranged within the reference portion of the magnetic cell junction may be oxidized. The oxidation of the layers within the reference portion of the magnetic cell junction may cause magnetic poles to form along the ends of the layers, altering the magnetic balance of the reference portion of the magnetic cell junction. In some cases, such a change in the magnetic balance of the reference portion may cause the magnetic cell junction to malfunction, reducing the reliability of the memory array.

Therefore, it would be desirable to develop a method for patterning a magnetic cell junction which does not alter the magnetic balance of the reference portion of the magnetic cell junction. In addition, it would be advantageous to develop a method which does not cause layers within magnetic cell junction to be undercut. Moreover, it would be beneficial to fabricate a magnetic cell junction using a patterning process that is not susceptible to shorts occurring across the junction's metal features.

SUMMARY OF THE INVENTION

The problems outlined above may be in large part addressed by an improved method for patterning a magnetic memory cell junction. In general, the method may include patterning a mask layer above a stack of layers. In some cases, the method may further include etching exposed portions of the stack of layers to a level spaced above a tunneling barrier layer of the stack of layers. In such an embodiment, the step of etching may include etching one or more magnetic layers of the stack of layers. More specifically, the method may include etching to a level within one of the magnetic layers. In some cases, the step of etching may include etching between approximately 20% and approximately 95% of a thickness of the stack of layers arranged above the tunneling barrier layer or more specifically, between approximately 50% and approximately 95% of a thickness of the layers arranged above the tunneling barrier layer.

In any case, the method may further include implanting dopants into remaining portions of the stack of layers arranged above the tunneling barrier layer. For example, the method may include oxidizing and/or nitriding the remaining portions of the stack of layers arranged above the tunneling barrier layer. Other dopant impurities, however, may also or alternatively be implanted, depending on the design specifications of the magnetic cell junction. In some cases, the step of implanting may be adapted to prevent the introduction of dopants into portions of the stack of layers underlying the tunneling barrier layer. In particular, the step of implanting may include implanting dopants with a low-energy source. For example, in some cases, the step of implanting may include oxidizing the stack of layers using a low or medium density plasma.

In addition or alternatively, a magnetic layer within the stack of layers may include a material adapted to prevent the introduction of dopants underlying the tunneling barrier layer during the step of implanting. In a preferred embodiment, the magnetic layer having such dopant retardant properties may be arranged below the tunneling barrier layer, or more specifically, below and in contact with the tunneling barrier layer. In such a case, the retardation of dopant implantation may be relative to the rate of dopant implantation in the magnetic layer overlying the tunneling barrier layer. Consequently, a magnetic memory cell junction is provided that includes a magnetic layer having a material adapted to retard the implantation of dopants relative to a rate of dopant implantation within a material of another magnetic layer within the magnetic memory cell junction. In some cases, the material adapted to retard dopant implantation may include cobalt-platinum. In yet other cases, however, the material may include cobalt-iron-boron. In any case, the magnetic cell junction provided herein may, in some embodiments, include another underlying magnetic layer spaced below the tunneling barrier layer. In some cases, the other underlying magnetic layer may also include a material adapted to retard the implantation of dopants relative to a rate of dopant implantation within the material of the magnetic layer overlying the tunneling barrier layer. Alternatively, the other underlying magnetic layer may not include a material adapted to retard the implantation of dopants relative to a rate of dopant implantation within the material of the magnetic layer overlying the tunneling barrier layer.

In any case, the length of the overlying magnetic layer may be shorter than a length of the underlying magnetic layer within the magnetic cell junction described above in some embodiments. In particular, the method of etching the stack of layers to a level above the tunneling barrier layer and implanting dopants within remaining portions of the stack of layers arranged above the tunneling barrier layer, as described above, may produce a magnetic cell junction with such a configuration. In other cases, however, the underlying and overlying magnetic layers may include substantially similar lengths. In such an embodiment, the method for forming the magnetic cell junction may include an alternative process. In particular, the method may include alternating the steps of etching and implanting dopants throughout the thickness of the exposed portions of the stack of layers. Alternatively stated, the method may include successively repeating the steps of etching and implanting throughout the thickness of the exposed portions of the stack of layers such that the magnetic cell junction is patterned to have layers within substantially similar lengths.

In some embodiments, such a method may generate veils along sidewalls of the patterned stack of layers during the etching steps. In general, "veils" may refer to the material redeposited upon the sidewall surfaces of the patterned magnetic cell junction during the etch process. In some cases, the method may include etching the stack of layers with a high density plasma such that the number of veils produced may be less than the number of veils produced when dry etch techniques, such as ion milling and/or reactive ion etching, are used for the etch processes. In any case, the method may include subsequent steps of implanting dopants into the generated veils. Since the method includes alternating the steps of etching and implanting in such an embodiment, the etch processes conducted subsequent to each of the implanting steps may remove the previously doped veils. Consequently, the number of veils along the sidewalls of a magnetic cell junction subsequent to the patterning process may be reduced or eliminated relative to a magnetic cell junction patterned using conventional techniques. As a result, the likelihood for forming shorts across the tunneling barrier layer of the patterned magnetic cell junction may be reduced or eliminated using the method described herein. In a preferred embodiment, alternating the steps of etching and implanting may include etching a greater amount of the stack of layers than the amount of the stack of layers implanted with dopants during the step of implanting.

There may be several advantages for patterning a magnetic cell junction using the methods described herein. For example, a magnetic cell junction may be patterned which is less susceptible to the formation of veils along its sidewall surfaces. As a result, the formation of shorts across the tunneling barrier layer of the magnetic cell junction may be less prone to occur with the methods described herein. In addition, the methods described herein offer a manner in which to pattern a magnetic cell junction without altering the magnetic balance of the reference portion of the cell junction. Furthermore, the methods described herein offer a manner in which to form a magnetic cell junction having lateral dimensions within the design specifications of the magnetic cell junction. In this manner, a memory array with high reliability may be fabricated. In particular, a memory array adapted to write bits to correct locations while inhibiting the writing of false bits may be fabricated. Consequently, a memory array fabricated using the methods described herein may operate with a tighter switching field distribution.

BRIEF DESCRIPTION OF THE DRAWINGS

Other objects and advantages of the invention will become apparent upon reading the following detailed description and upon reference to the accompanying drawings in which:

FIG. 7b depicts a magnified view of a portion FIG. 7a;

FIG. 8a depicts a partial cross-sectional view of the upper portion in which dopants are introduced into the topography subsequent to etching exposed portions of the topography in FIG. 7a;

FIG. 8b depicts a magnified view of a portion FIG. 8a;

FIG. 9a depicts a partial cross-sectional view of the upper portion in which exposed portions of the microelectronic topography are etched subsequent to the introduction of dopants in FIG. 8a;

FIG. 9b depicts a magnified view of a portion FIG. 9a;

FIG. 10a depicts a partial cross-sectional view of the upper portion in which dopants are introduced into the topography subsequent to etching exposed portions of the topography in FIG. 9a;

FIG. 10b depicts a magnified view of a portion FIG. 10a; and

FIG. 11 depicts a partial cross-sectional view of the upper portion in which the exposed portions of the topography have been alternately introduced within dopants and etched subsequent to the etching of the exposed portions in FIG. 10a.

Figure 1:
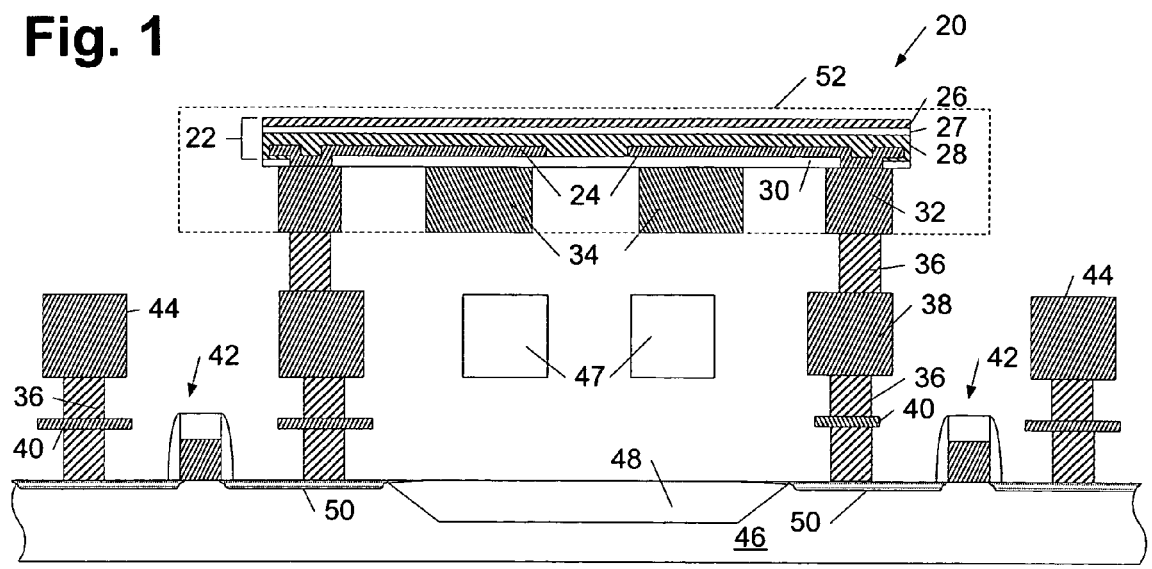
FIG. 1 depicts a partial cross-sectional view of a microelectronic topography.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 4:
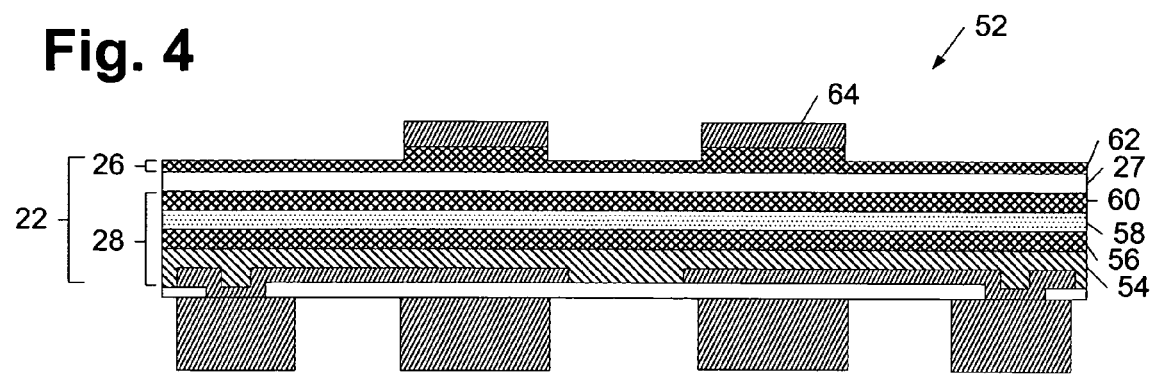
FIG. 4 depicts a partial cross-sectional view of the upper portion in which exposed portions of the microelectronic topography are etched subsequent to the patterning of the masking layer in FIG. 3.
Figure 5:
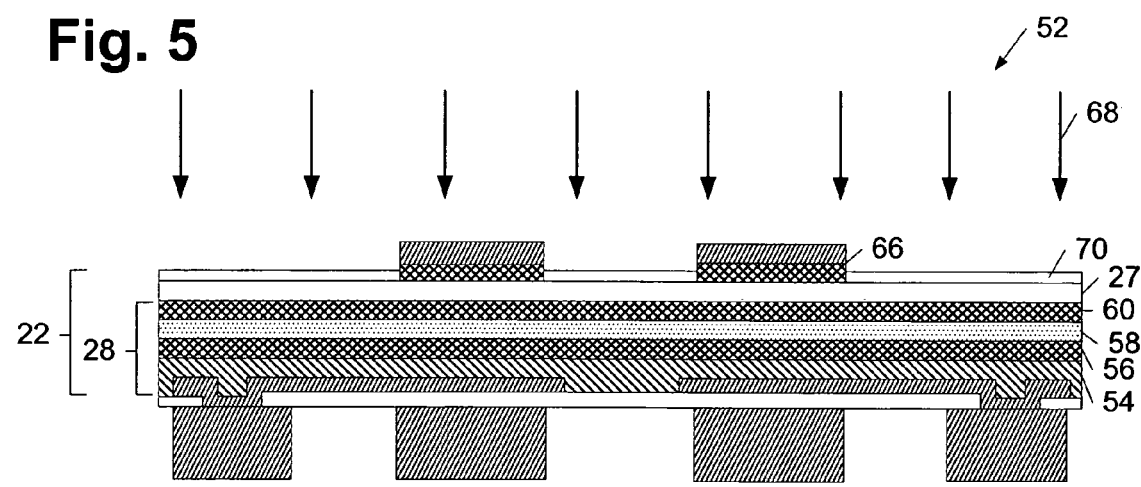
FIG. 5 depicts a partial cross-sectional view of the upper portion in which dopants have been introduced into the microelectronic topography subsequent to etching exposed portions of the topography in FIG. 4.
Figure 6:
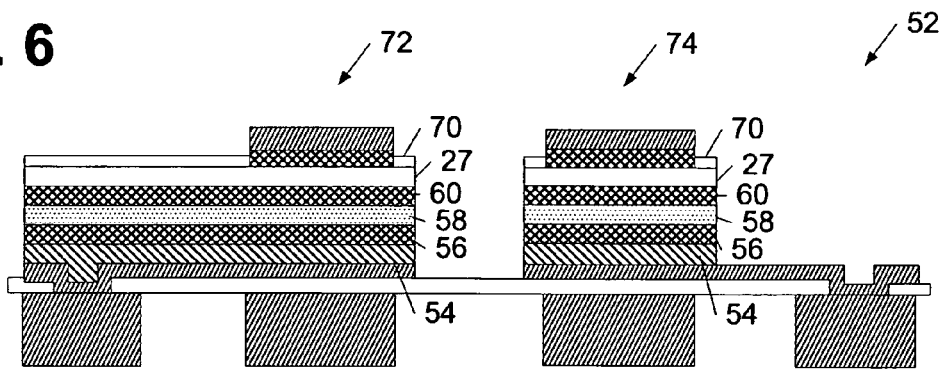
FIG. 6 depicts a partial cross-sectional view of the upper portion in which a plurality of lower layers are patterned subsequent to introduction of dopants in FIG. 5.

Turning to the drawings, exemplary embodiments of methods for patterning a magnetic cell junction are provided. In particular, FIGS. 4–6 illustrate a method in which exposed portions of a stack of layers are etched to a level above a tunneling barrier layer and remaining portions of the layers above the tunneling barrier layer are implanted with dopants such that a lower portion of the magnetic cell junction may be patterned. On the other hand, FIGS. 7a–11 illustrate a method which includes successively repeating the steps of etching and implanting dopants throughout the entirety of the stack of layers such that the entirety of the magnetic cell junction is patterned in a continuous process. An exemplary microelectronic topography which may be used for such methods is described in FIGS. 1–3. In particular, FIG. 1 depicts a partial cross-sectional view of microelectronic topography 20 which includes plurality of layers 22 formed above electrodes 24. As will be described in more detail below, plurality of layers 22 may be used to form magnetic cell junctions within microelectronic topography 20 and, therefore, may include storing portion 26, tunneling barrier layer 27, and pinned portion 28. More specifically, the composition and function of such portions are described in reference to FIG. 2.

As illustrated in FIG. 1, electrodes 24 may be spaced above dielectric layer 30 and respectively coupled to contact structures 32. In general, electrodes 24 may be used to induce a conductive path between subsequently formed magnetic cell junctions and overlying and underlying portions of microelectronic topography 20, respectively. In this manner, FIG. 1 may illustrate a cross-sectional view of a differential memory cell partially fabricated within a magnetic random access memory (MRAM) array. Alternatively, however, FIG. 1 may illustrate a cross-sectional view of two single memory cells partially fabricated within an MRAM array. In either case, microelectronic topography 20 may include other memory cells arranged in alignment with the memory cell/s depicted in FIG. 1.

In addition, the other memory cells may include substantially similar components as the memory cell/s depicted in FIG. 1. In particular, the other memory cells may include digit lines 34, via plugs 36, additional contact structures 38, interconnects 40, transistor gates 42, ground line 44 and word lines 47 formed above semiconductor substrate 46 which has isolation regions 48 and diffusion regions 50 arranged therein as shown in FIG. 1. It is noted that word lines 47 are connected to transistor gates 42 along a different cross-sectional plane of topography 20 than shown in FIG. 1. In general, word lines 47 may serve to activate transistor gates 42 such that current may flow from the memory cell to ground line 44. In this manner, current flow may be generated through the subsequently formed magnetic cell junctions such that read operations may be conducted. In general, the dimensions and compositions of electrodes 24, dielectric layer 30, digit lines 34, via plugs 36, interconnects 40, transistor gates 42, substrate 46, isolation regions 48, diffusion regions 50, and contact structures 32, 38 and 44 may be in accordance with design specifications generally known in the MRAM array fabrication industry. It is noted that the components of microelectronic topography 20 are not drawn to scale in FIG. 1. For instance, the total thickness of plurality of layers 22 may be on the order of hundreds of angstroms, while the thickness of digit lines 34 may be on the order of thousands of angstroms.

As noted above, plurality of layers 22 may be patterned into magnetic cell junctions of an MRAM array. In some embodiments, a magnetic cell junction of an MRAM array may include a dielectric tunneling barrier layer interposed between two magnetic portions such that tunnel magnetoresistance may be employed during the read operations of the array. In particular, a magnetic cell junction of an MRAM array may include a dielectric tunneling barrier layer interposed between one magnetic portion with a fixed magnetic direction and another magnetic portion that does not have a fixed magnetic direction. Consequently, plurality of layers 22 may include tunneling barrier layer 27 interposed between pinned portion 28 with a fixed magnetic direction and storing portion 26 which does not have a fixed magnetic direction.

In general, tunneling barrier layer 27 may be used to pass electrons between the magnetic layers of pinned portion 28 and storing portion 26 of the subsequently formed magnetic cell junctions. More specifically, tunneling barrier layer 27 may serve to provide quantum mechanical tunneling between pinned portion 28 and storing portion 26. Exemplary materials for tunneling barrier layer 27 may include, for instance, aluminum oxide, aluminum nitride, tantalum oxide, titanium oxide, hafnium oxide, magnesium oxide, or zirconium oxide. In addition, tunneling barrier layer 27 may include a thickness between approximately 5 angstroms and approximately 300 angstroms, or more specifically between approximately 6 angstroms and approximately 25 angstroms. Larger or smaller thicknesses of tunneling barrier layer 27 may be appropriate depending on the design specifications of the magnetic cell junction.

In general, pinned portion 28 may be adapted such that its set magnetic direction is not altered by the presence of large external magnetic fields. Storing portion 26, on the other hand, may be adapted to switch its magnetic direction with the presence of magnetic fields. In this manner, the logic state of the bit stored within the magnetic cell junctions formed from plurality of layers 22 may be characterized by storing portion 26 relative to pinned portion 28. More specifically, the resistance across the tunnel junction depends on the respective orientation of the magnetic moment of pinned portion 28 and storing portion 26 and, therefore, may be used to indicate the logic state of the bit stored within the magnetic cell junction. Consequently, pinned portion 28 may be used as a reference direction for the magnetic direction in storing portion 26. In general, pinned portion 28 and storing portion 26 may include a plurality of layers as described in more detail below in reference to FIG. 2. The plurality of layers of each portion, however, is not illustrated in FIG. 1 to simplify the illustration of the drawing.

Figure 2:
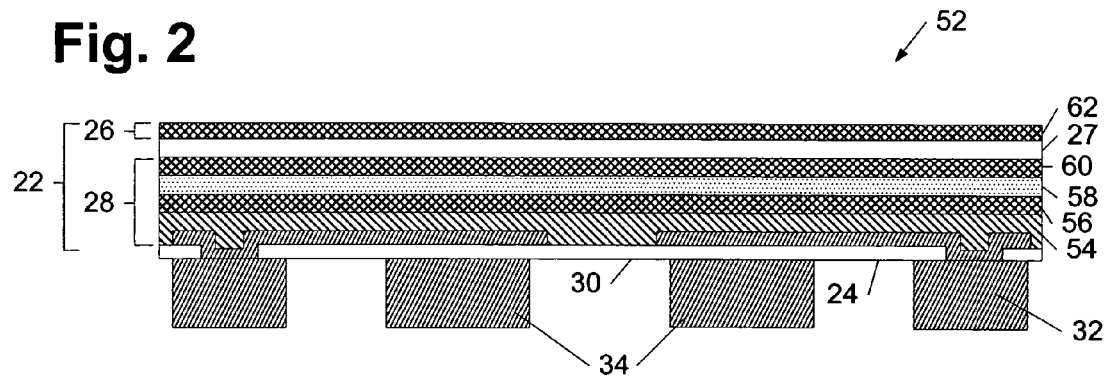
FIG. 2 depicts a partial cross-sectional view of an upper portion of the microelectronic topography of FIG. 1.

Upper portion 52 of microelectronic topography 20, as outlined by the dotted line in FIG. 1, may extend between the upper surface of storing portion 26 and the lower surfaces of contact structures 32 and digit lines 34. As such, a magnified view of upper portion 52 may depict a detailed layer configuration of plurality of layers 22, as shown in FIG. 2. In general, the composition, thickness, number, and arrangement of layers within plurality of layers 22 used for the method described herein may differ from those shown and described in FIG. 2. In particular, plurality of layers 22 may include additional or fewer layers than shown in FIG. 2. As such, it is noted that several layer configurations may be used for the method described herein. In addition, the portions of microelectronic topography 20 illustrated in FIG. 2 are not drawn to scale. In particular, the thickness of plurality of layers 22 are greatly exaggerated in FIG. 2 to distinguish the layers within storing portion 26 and pinned portion 28.

As shown in FIG. 2, pinned portion 28 may include layers 54–60. More specifically, pinned portion 28 may include antiferromagnetic (AF) layer 54, magnetic layer 56, coupling layer 58, and magnetic layer 60. In some embodiments, pinned portion 28 may further include a contact layer interposed between AF layer 54 and electrode 24 to enhance the electrical connection between the subsequently formed magnetic cell junction and the electrode. Such an additional contact layer may include any conductive material, such as aluminum, cobalt, copper, iron, nickel, nickel-iron-chromium, platinum, tantalum, titanium, tungsten, or a metal alloy thereof. In some embodiments, the additional contact layer may further include a seed material formed above the conductive material. In some cases, the seed material may serve to align the crystalline structure of AF layer 54. Consequently, in some embodiments, the seed layer material may include a material used in the microelectronics industry for aligning the crystalline structures layers with AF materials, such as nickel-iron materials or more specifically, permalloy. Other materials used for aligning the crystalline structure of AF materials, however, may be used for the seed layer material, depending on the design specifications of the magnetic cell junction. In any case, the additional contact layer within pinned portion 28 may include a thickness between approximately 100 angstroms and approximately 1000 angstroms. However, larger and smaller thickness of the additional contact layer may be appropriate depending on the design specifications of the magnetic cell junction. In yet other embodiments, pinned portion 28 may not include such an additional contact layer.

In general, AF layer 54 may be adapted to set and orient the magnetic direction of magnetic layer 56. More specifically, AF layer 54 may be adapted to set the magnetic direction of magnetic layer 56 such that the magnetic direction is not easily altered by the presence of external magnetic fields. In this manner, magnetic layer 56 may be referred to as a "pinned magnetic layer." In general, setting the magnetic direction of magnetic layer 56 may include coupling the magnetic directions of AF layer 54 and magnetic layer 56 such that a stable magnetic direction may be obtained. Such a process may be conducted prior to or subsequent to patterning the memory cell junction. In any case, materials which may be used for AF layer 54 may include magnetic materials which are adapted to orient and pin the magnetic direction of layers. For instance, AF layer 54 may include antiferromagnetic materials such as, alloys of platinum-manganese (Pt—Mn), nickel-manganese (Ni—Mn), iridium-manganese (Ir—Mn), iron-manganese (Fe—Mn), osmium-manganese (Os—Mn), platinum-palladium-manganese (Pt—Pd—Mn), ruthenium-rhodium-manganese (Ru—Rd—Mn), and platinum-manganese-chromium (Pt—Mn—Cr), for example. Other antiferromagnetic materials, however, may be appropriate for AF layer 54 depending on the design specifications of the magnetic cell junction. In general, the thickness of AF layer 54 may be between approximately 50 angstroms and 400 angstroms, in some cases. However, other thicknesses of AF layer 54 may be appropriate, depending on the design specifications of the magnetic cell junction.

In general, "antiferromagnetic," as used herein, may refer to the state of a material having magnetic spins oriented in opposite directions relative to each other. In particular, an antiferromagnetic material may include magnetic spins arranged in fixed directions oriented antiparallel to each other such that they counterbalance each other, rendering an overall magnetic direction of the material nonexistent. In contrast, "ferromagnetic" may refer to a state in which the magnetic spins within a layer are fixed in generally the same direction or are, in other words, arranged parallel to each other. In this manner, "ferromagnetic" may refer to a state in which a magnetic direction of the layer may be determined by the overall direction of the magnetic spins within the layer. Consequently, since the magnetic direction of magnetic layer 56 is preferably pinned in a particular direction, the material used for magnetic layer 56 may include any magnetic material, such as cobalt-iron, nickel-iron, nickel-iron-cobalt alloys, cobalt-zirconium-niobium, or cobalt-iron-boron, which are in a ferromagnetic state. Other magnetic materials that are used in the MRAM fabrication industry, however, may also or alternatively be used for magnetic layer 56, depending on the design specifications of the magnetic cell junction.

In particular, it may be advantageous, in some embodiments, for magnetic layer 56 to have a material adapted to prevent the introduction of dopants as discussed in more detail below in reference to FIG. 5. More specifically, it may be advantageous for magnetic layer 56 to include a material having dopant retardation properties relative to the rate of dopant implantation within the materials of storing portion 26, particularly magnetic layer 62. In some cases, the material adapted to retard dopant implantation may include cobalt-platinum or cobalt-iron-boron. Alternatively, the material adapted to retard dopant implantation may include polycrystalline alloys comprising one or more noble elements. In yet other embodiments, the material adapted to retard dopant implantation may include materials with an amorphous structure. In any case, the aforementioned materials may be particularly advantageous for preventing the introduction of oxygen and/or nitrogen within magnetic layer 56. Other materials which are adapted to retard the introduction of dopant impurities, including but not limited to oxygen and nitrogen, however, may be used for magnetic layer 56, depending on the design specifications of the magnetic cell junction. In any case, the thickness of magnetic layer 56 may be generally between approximately 20 angstroms and approximately 100 angstroms. However, other thicknesses of magnetic layer 56 may be appropriate, depending on the design specifications of the magnetic cell junction.

In any case, the magnetic field generated from one magnetic layer may affect the magnetic direction of adjacent layers. As such, in order to prevent the magnetic field of pinned portion 28 from influencing the magnetic direction of the free layer in storing portion 26, the overall magnetic spin within pinned portion 28 should be substantially zero. Such an overall magnetic spin may be achieved by counteracting the magnetic field generated from magnetic layer 56. More specifically, pinned portion 28 may be fabricated with an additional magnetic layer having a magnetic direction set in a substantially opposite direction than magnetic layer 56. As such, pinned portion 28 may further include coupling layer 58 and magnetic layer 60 formed above magnetic layer 58, as shown in FIG. 2. In particular, pinned portion 28 may also include coupling layer 58 interposed between magnetic layer 60 and magnetic layer 56. In yet other embodiments, pinned portion 28 may be absent of an additional magnetic layer and a coupling layer. As such, although the embodiments provided herein include coupling layer 58 and magnetic layer 60, the method described herein is not restricted to the inclusion of such layers.

In general, coupling layer 58 may be used to set the magnetic direction of magnetic layer 60 in a direction opposite (i.e., antiparallel) to the magnetic direction of magnetic layer 56. Consequently, magnetic layer 60 may be referred to as a "fixed magnetic layer." More specifically, coupling layer 58 may include a material which has an inherent property to set the magnetic direction of an adjacent magnetic material in an opposite direction than another adjacent material. For example, coupling layer 58 may include ruthenium or any other material comprising such a property. Advantageously, the inclusion of coupling layer 58 and magnetic layer 60 may make pinned portion 28 even more difficult to switch with the application of external magnetic fields. In other words, larger external magnetic fields may be needed to switch a reference magnetic direction in embodiments in which pinned portion 28 includes an additional magnetic layer and a coupling layer as described herein. In general, the thickness of coupling layer 58 may be between approximately 5 angstroms and approximately 15 angstroms. However, larger or smaller thicknesses of coupling layer 58 may be used, depending on the design specifications of the magnetic cell junction.

In some cases, the material used for magnetic layer 60 may be similar to that of magnetic layer 56. As such, in some embodiments, magnetic layer 60 may include any magnetic material, such as cobalt-iron, nickel-iron, nickel-iron-cobalt alloys, cobalt-zirconium-niobium, or cobalt-iron-boron, which is in a ferromagnetic state. In other cases, however, it may be advantageous for magnetic layer 60 to have a material adapted to prevent the introduction of dopants as discussed in more detail below in reference to FIG. 5. More specifically, it may be advantageous for magnetic layer 60 to include a material having dopant retardation properties relative to the rate of dopant implantation within the materials of storing portion 26, particularly magnetic layer 62. In some cases, the material adapted to retard dopant implantation may include cobalt-platinum or cobalt-iron-boron. Alternatively, the material adapted to retard dopant implantation may include polycrystalline alloys comprising one or more noble elements. In yet other embodiments, the material adapted to retard dopant implantation may include materials with an amorphous structure. In any case, the aforementioned materials may be particularly advantageous for preventing the introduction of oxygen and/or nitrogen within magnetic layer 60. Other materials which are adapted to retard the introduction of dopant impurities, including but not limited to oxygen and nitrogen, however, may be used for magnetic layer 60, depending on the design specifications of the magnetic cell junction.

In any case, the thickness of magnetic layer 60 may be similar to that of magnetic layer 56 and, therefore, may between approximately 20 angstroms and approximately 100 angstroms. Materials and/or thicknesses that differ from magnetic layer 56, however, may be used for magnetic layer 60, depending on the design specifications of the magnetic cell junction. In addition, different thicknesses and/or materials than the ones listed for magnetic layer 56 may be used for magnetic layer 60, depending on the design specifications of the magnetic cell junction. In some embodiments, magnetic layer 60, as well as magnetic layer 56, may include a plurality of layers. For example, in some embodiments, magnetic layers 60 and 56 may include a plurality of magnetic materials in ferromagnetic states. In some cases, the plurality of magnetic layers may include the same material. In other embodiments, the plurality of ferromagnetic layers may include different materials.

As shown in FIGS. 1 and 2, plurality of layers 22 may include storing portion 26 spaced above pinned portion 28 and in contact with tunneling barrier layer 27. As stated above, storing portion 26 may be adapted to have a magnetic direction which is not fixed in a particular direction. More specifically, storing portion 26 may include magnetic layer 62 which is able to rotate its magnetic direction relative to the magnetic direction of magnetic layer 60 during writing operations of the magnetic memory array. Consequently, magnetic layer 62 may be referred to as a "free magnetic layer." In general, magnetic layer 62 may include any magnetic material in a ferromagnetic state, such as cobalt-iron, nickel-iron, nickel-iron-cobalt alloys, cobalt-zirconium-niobium, or cobalt-iron-boron, for example. Other ferromagnetic materials used in the MRAM fabrication industry, however, may also or alternatively be used for magnetic layer 62, depending on the design specifications of the magnetic cell junction. In some embodiments, magnetic layer 62 may include a plurality of layers. For example, in some embodiments, magnetic layer 62 may include a plurality of ferromagnetic materials. In such an embodiment, the plurality of ferromagnetic layers may include the same material in some cases. In other embodiments, the plurality of ferromagnetic layers may include different materials. In any case, magnetic layer 62, may be between approximately 20 angstroms and approximately 100 angstroms. However, larger or smaller thicknesses of magnetic layer 62 may be used, depending on the design specifications of the magnetic cell junction.

Figure 3:
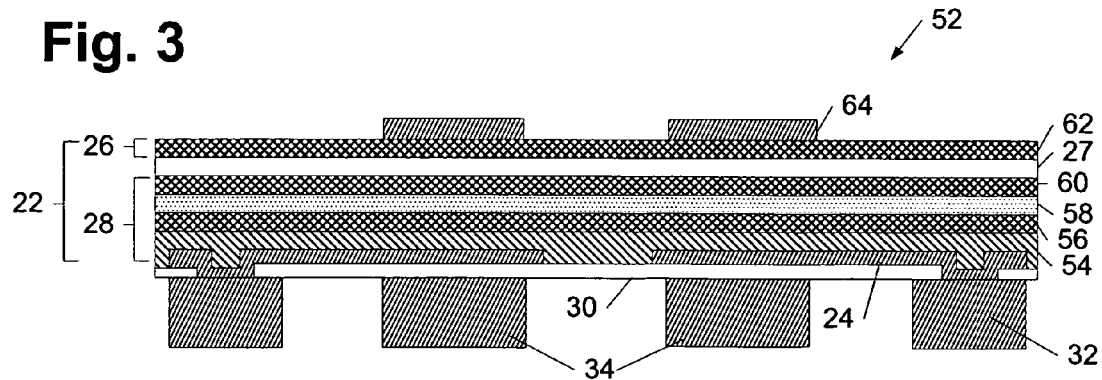
FIG. 3 depicts a partial cross-sectional view of the upper portion of FIG. 2 subsequent to patterning a masking layer upon the topography.

Turning to FIG. 3, masking layer 64 may be patterned above storing portion 26. More specifically, masking layer 64 may be formed upon storing portion 26 in a pattern with which to outline the magnetic cell junctions from plurality of layers 22. In general, the thickness of masking layer 64 may be between approximately 20 angstroms and approximately 1000 angstroms. However, larger or smaller thicknesses of masking layer 64 may be appropriate depending on the design specifications of the memory array. Although FIG. 3 illustrates the formation of two masks, any number of masks may be formed across storing portion 26 in accordance with design specifications of the memory array. In addition, masking layer 64 may be formed with various dimensions and spacings in accordance with the design specifications of the memory array.

In general, masking layer 64 may include a material which may or may not be removed during the subsequent patterning of storing portion 26 and/or pinned portion 28 as described in more detail below in reference to FIGS. 4–10. For example, in some embodiments, masking layer 64 may include a dielectric such as silicon nitride or silicon oxynitride, for example. Alternatively, masking layer 64 may include a metal nitride layer, such as titanium nitride or tungsten nitride, for example. In other embodiments, masking layer 64 may include a photoresist, such as a deep ultraviolet resist, an I-line resist, a G-line resist, or another resist, such as an e-beam resist or an x-ray resist. In yet another embodiment, masking layer 64 may subsequently serve an additional role as a conductive layer of the memory array such that electrical connection may be made with other conductive structures or layers overlying the subsequently patterned magnetic cell junctions. Consequently, in some embodiments, masking layer 64 may include a conductive material, such as aluminum, cobalt, copper, iron, nickel, nickel-iron-chromium, platinum, tantalum, titanium, tungsten, or a metal alloy or silicide thereof.

In some embodiments, the method described herein may continue to FIG. 4 in which exposed portions of storing portion 26 are removed to a level spaced above tunneling barrier layer 27. In general, the level to which storing portion 26 is etched may be any depth within the storing portion. In some cases, the removal process may include etching between approximately 20% and approximately 95% of a thickness of storing portion 26, or more specifically between approximately 50% and approximately 90% of the thickness of storing portion 26. In any case, the removal of at least a portion of storing portion 26 may reduce the thickness of the portion to be subsequently implanted with dopants as discussed in reference to FIG. 5. Consequently, a low-energy dopant implantation process may be used to introduce impurities into remaining portions of storing portion 26. The use of such a low-energy process may advantageously prevent the introduction of impurities within layers underlying tunneling barrier layer 27 as described in more detail below in reference to FIG. 5. As stated above, in some embodiments, storing portion 26 may include more than one layer. In such an embodiment, the removal process depicted in FIG. 4 may include removing an upper region of storing portion 26 to a level within any one of the layers of the storing portion. In yet another embodiment, the removal process may include removing an upper region of storing portion 26 to a level commensurate with an interface between the layers of storing portion 26.

Such a removal process may include any dry or plasma etch process used in the microelectronics fabrication industry. For example, the removal of the upper region of exposed portions of storing portion 26 may include reactive ion etching or ion milling. Alternatively, the etch process may employ a low, medium, or high density plasma. A "high density plasma," as used herein, may refer to a plasma having an electron density greater than approximately $1.0 \times 10^{12}$ cm$^{-3}$. On the contrary, a "medium density plasma", as used herein, may refer to a plasma having an electron density between approximately $1.0 \times 10^{8}$ cm$^{-3}$ and approximately $1.0 \times 10^{12}$ cm$^{-3}$, while a "low density plasma" may refer to a plasma having an electron density less than approximately $1.0 \times 10^{8}$ cm$^{3}$. In some cases, it may be advantageous to employ a high-density fluorine or chlorine based plasma etch process. More specifically, a high-density fluorine or chlorine based plasma may offer a controlled and efficient manner within which to etch exposed portions of microelectronic topography 20 to a level within storing portion 26 as shown in FIG. 4.

In any case, the method for patterning the magnetic cell junctions may continue to FIG. 5 in which dopant impurities 68 are introduced into exposed portions of storing portion 26 to form doped portions 70. In a preferred embodiment, the exposed portions of storing portion 26 may be introduced with a high enough concentration of dopant impurities 68 such that doped portions 70 are rendered inactive. In this manner, region 66 of storing portion 26 underlying masking layer 64 may define the boundaries of the storing portion of the subsequently formed magnetic cell junction. In some embodiments, dopants 68 may be further introduced into tunneling barrier layer 27. On the contrary, however, it is preferable for dopants 68 not to be introduced within pinned portion 28 or more specifically, within magnetic layer 60. An introduction of impurities within pinned portion 28 may undesirably cause magnetic poles to form along the ends of the layers within the pinned portion. Such a formation of magnetic poles along the ends of the layers may alter the magnetic balance of pinned portion 28, reducing the reliability of the memory array.

Consequently, in some embodiments, the step of introducing dopants 68 may be adapted to prevent the introduction of such impurities within layers underlying tunneling barrier layer 27. In particular, the step of implanting may be conducted with a low-energy source such that the depth of dopants 68 may be limited. For example, in some cases, the step of introducing the dopants 68 may include exposing microelectronic topography 20 to a low or medium density plasma. Alternatively, the step of implanting may include exposing microelectronic topography 20 to a high density plasma. As noted above, a "high density plasma," as used herein, may refer to a plasma having an electron density greater than approximately $1.0 \times 10^{12}$ cm$^{-3}$, a "medium density plasma," as used herein, may refer to a plasma having an electron density between approximately $1.0 \times 10^{8}$ cm$^{-3}$ and approximately $1.0 \times 10^{12}$ cm$^{-3}$, and a "low density plasma" may refer to a plasma having an electron density less than approximately $1.0 \times 10^{8}$ cm$^{-3}$. In yet another embodiment, microelectronic topography 20 may be exposed to a gas phase of dopant impurities 68 at room temperature or at an elevated temperature. In some cases, the introduction of dopant impurities 68 may be conducted during an annealing cycle.

In addition or alternatively, pinned portion 28 may be adapted to prevent the introduction of dopants 68 underlying tunneling barrier layer 27 during the step of implanting. In particular, magnetic layer 60 and, in some embodiments magnetic layers 56 and/or 60, may include a material with retardant properties specific to the dopants introduced into storing portion 26 and relative to the rate of dopant implantation in the remaining portions of storing portion 26. For instance, magnetic layers 56 and/or 60 may include cobalt-platinum or cobalt-iron-boron. Alternatively, magnetic layers 56 and/or 60 may include polycrystalline alloys comprising one or more noble elements. In yet other embodiments, magnetic layers 56 and/or 60 may include materials with an amorphous structure. In some cases, the aforementioned materials may be particularly advantageous for preventing the introduction of oxygen and/or nitrogen within magnetic layers 56 and/or 60. Consequently, the method may include oxidizing and/or nitriding the remaining portions of storing portion 26 in FIG. 5, in some embodiments. In particular, in some cases, the method may include exposing microelectronic topography 20 to both oxygen and nitrogen at the same time. In general, however, any dopant impurity that may render exposed portions of storing portion 26 inactive may be implanted using the method described herein. As such, dopant impurities other than oxygen and/or nitrogen may be used, depending on the design specifications of the magnetic cell junction. In addition, other materials which are adapted to retard the introduction of such impurities may also or alternatively be used for magnetic layers 56 and/or 60.

FIG. 6 illustrates patterning layers 54, 56, 58, 60, 27, and 70 to form magnetic cell junctions 72 and 74. In general, such an etch process may be adapted to substantially terminate upon exposure of dielectric layer 30. In particular, the etch process may include wet or dry etch techniques known in the MRAM fabrication industry. In some embodiments, a high density plasma may be preferred for such an etch process. In any case, the previous introduction of dopants within microelectronic topography 20 as discussed above in reference to FIG. 5 preferably does not extend to layers underlying tunneling barrier layer 27. As such, any layers underlying tunneling baffler layer 27 are still considered "active" (i.e., the underlying layers still maintain their properties for setting a pinned magnetic direction). Consequently, the patterning process described in reference to FIG. 6 may be used to define the lateral boundaries of the pinned portions within magnetic cell junctions 72 and 74.

As shown in FIG. 6, the pinned portions of magnetic cell junctions 72 and 74 may have different lengths than the storing portions of the magnetic cell junctions. Consequently, the etch process of FIG. 6 may further include the formation of an additional masking layer with which to pattern the pinned portions. Although FIG. 6 illustrates two different pattern configurations for magnetic cell junctions 72 and 74, magnetic cell junctions within an array are generally patterned having substantially similar dimensions. Consequently, the illustration of FIG. 6 is not necessarily representative of a two magnetic cell junctions that may be aligned within a magnetic memory array. On the contrary, the illustration of FIG. 6 is merely used to show exemplary dimensional configurations for magnetic cell junctions that may be patterned using the method described herein. As will be discussed in more detail below, other dimensional configurations may be used for magnetic cell junctions formed from the method described herein as well.

In general, the lengths of the pinned portion within the patterned magnetic cell junctions may vary between the length of the storing portion defined within the magnetic cell junctions and the length of the underlying electrode. In particular, remaining portions 70 of storing portion 26, tunneling barrier layer 27, and pinned portion 28 may be patterned in alignment with electrode 24 to form magnetic cell junction 72, for example. In contrast, remaining portions 70 of storing portion 26, tunneling barrier layer 27, and pinned portion 28 may be patterned to form magnetic cell junction 74 having a storing portion which is nearly centered above a lower pinned portion. In yet other embodiments, however, the lateral boundaries of the pinned portion with the patterned magnetic cell junctions may vary from those of magnetic cell junctions 72 and 74. In any case, remaining portions 70 of storing portion 26, tunneling barrier layer 27, and pinned portion 28 may be patterned such that the pinned portion of the magnetic cell junction has a greater length than the defined storing portion of the magnetic cell junction. In yet other embodiments, however, the magnetic cell junction may be patterned such that its storing portion and pinned portion have substantially similar lengths. An exemplary method resulting in such a configuration is described in more detail below in reference to FIGS. 7a–11.

Figure 9A:
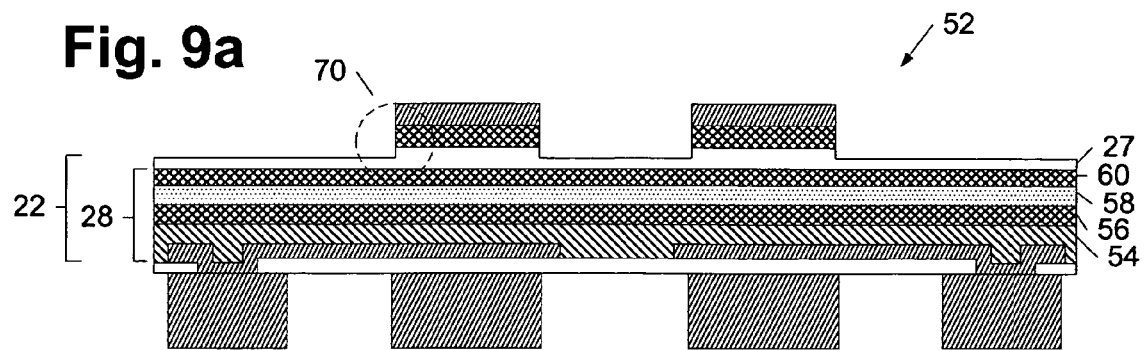
Figure 9B:
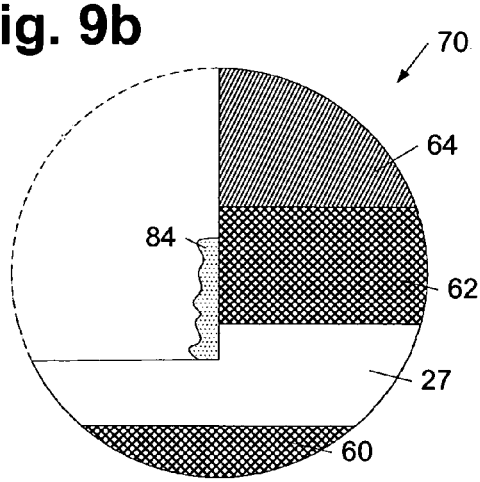
Figure 10B:
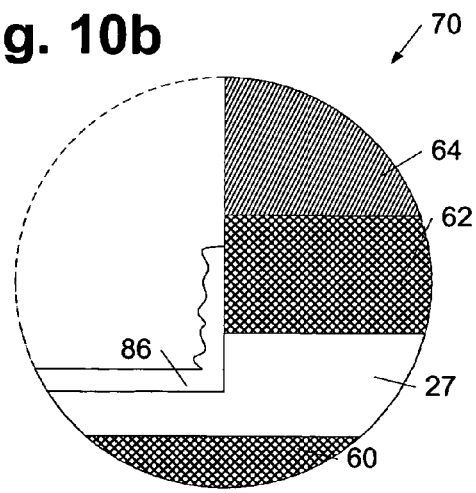
Figure 10A:
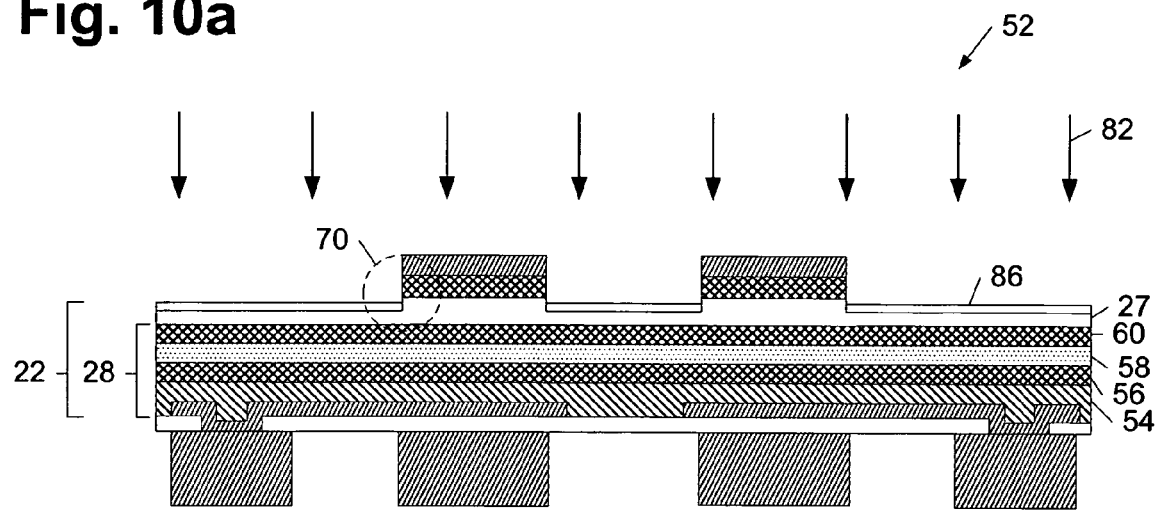
Figure 11:
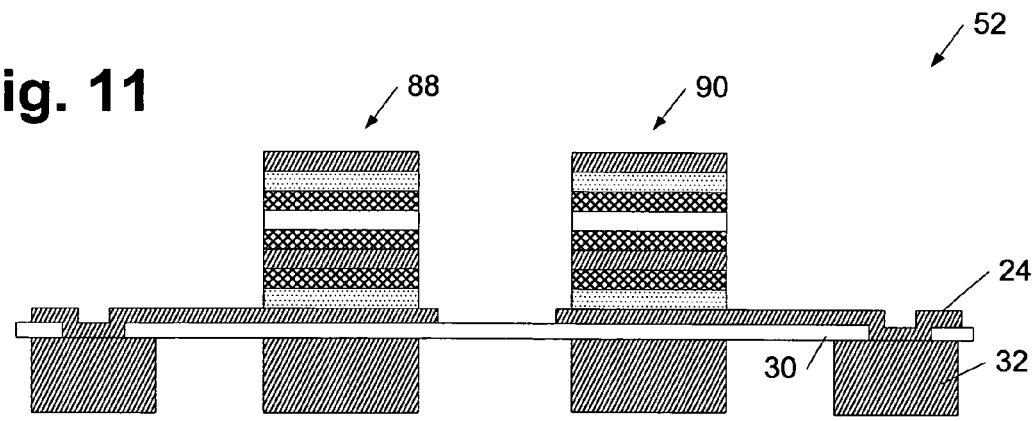

FIGS. 7a–10a illustrate a start of an alternating sequence of steps that may be used to pattern a magnetic cell junction from plurality of layers 22 subsequent to the formation of masking layer 64 in FIG. 3. In particular, FIGS. 7a–10a illustrate alternating steps of etching exposed portions of plurality of layers 22 and implanting dopants into exposed portions of plurality of layers 22. Such a sequence of steps may be initiated with a step of implanting followed by successive steps of etching and implanting. Alternatively, the sequence of steps may be initiated with a step of etching followed by successive steps of implanting and etching as shown in FIGS. 7a–10a. In any case, the alternating sequence of the steps may be carried out throughout the thickness of the exposed portions of the stack of layers. Alternatively stated, the method may include successively repeating the steps of etching and implanting throughout the thickness of the exposed portions of the stack of layers such that patterned magnetic cell junctions are formed as shown in FIG. 11.

The sequence of steps described in reference to FIGS. 7a–10a are also described in reference to FIGS. 7b–10b, in which magnified views of portion 70 of microelectronic topography 20 detailing the patterned sidewalls of the magnetic cell junction are shown for each respective step of the process. In particular, FIGS. 7b–10b describe the generation and removal of veils along the sidewalls of the magnetic cell junction throughout the patterning process. In general, "veils" may refer to the material redeposited upon the sidewall surfaces of the patterned magnetic cell junction during the etch process as described in more detail below in reference to FIG. 7b. Typically, the thicknesses of veils are on the order of a few angstroms and, therefore, are not depicted in FIGS. 7a–10a.

Figure 7A:
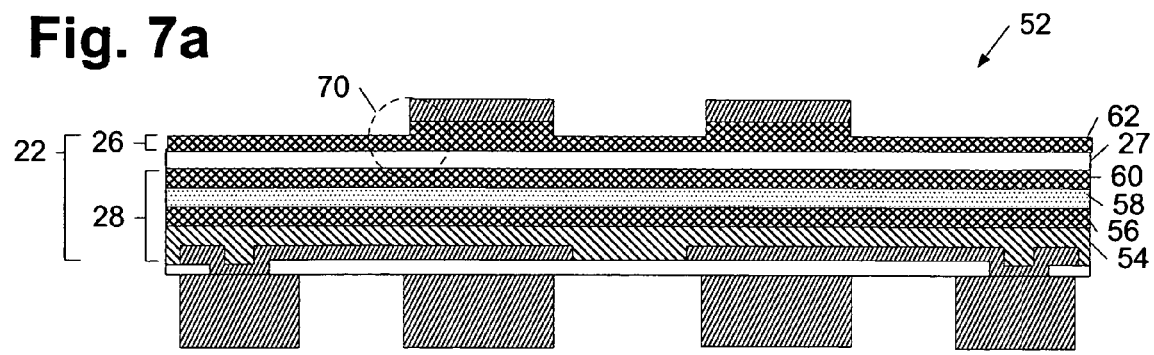
FIG. 7a depicts a partial cross-sectional view of the upper portion, in an alternative embodiment, in which exposed portions of the microelectronic topography are etched subsequent to the patterning of the masking layer in FIG. 3.

Turning to FIG. 7a, an upper region of exposed portions of microelectronic topography 20 has been removed subsequent to the patterning of masking layer 64 in FIG. 3. Such a removal process may include etching a relatively small amount of the exposed portions of microelectronic topography 20. For example, in some embodiments, the removal process may include etching between approximately 10 angstroms and approximately 100 angstroms of microelectronic topography 20. In this manner, the removal process may include removing an upper region of exposed portions of microelectronic topography 20 to a level within magnetic layer 62. In yet other embodiments, the removal process may include removing an upper region of exposed portions of microelectronic topography 20 to a level within another magnetic layer of plurality of layers 22. Consequently, larger or smaller amounts of microelectronic topography 20 may be removed during the etch process described in reference to FIG. 7b, depending on the design specifications of the magnetic cell junction.

In any case, the removal process may include any dry or plasma etch process used in the microelectronics fabrication industry. For example, the etch process may employ a low, medium, or high density plasma. Alternatively, the removal process may include reactive ion etching or ion milling. In some cases, it may be advantageous to employ a high-density fluorine or chlorine based plasma etch process. In particular, a high-density fluorine or chlorine based plasma may offer a controlled and efficient manner in which to etch a small region of exposed portions of microelectronic topography 20. In addition, a high density plasma may generate a fewer number of veils than the number of veils produced when dry etch techniques, such as ion milling and/or reactive ion etching, are used for the etch process. The generation of veils during the etch process of FIG. 7a is described in more detail below in reference to FIG. 7b.

Figure 7B:
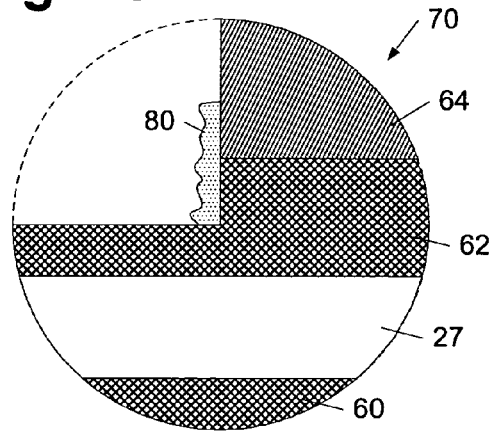

FIG. 7b illustrates a magnified view of portion 70 of microelectronic topography 20 subsequent to the etch process described in reference to FIG. 7a. In particular, FIG. 7b illustrates a magnified view of the patterned sidewalls of masking layer 64 and magnetic layer 62. As shown in FIG. 7b, veil 80 may be formed along the patterned sidewalls of magnetic layer 62 and masking layer 64 as a result of the etching process described in reference to FIG. 7a. In particular, the etching process described in reference to FIG. 7a may include redepositing byproducts formed during the etch process along the sidewalls of the patterned structure. Such byproducts may be referred to herein as "veils." In general, veils may include compounds from the one or more layers removed during the etch process and/or the one or more elements used in the etch chemistry used for the etch process. Typically, the thicknesses of veils are on the order of a few angstroms to tens of angstroms and, therefore, veil 80 is not depicted in FIG. 7a.

Although veil 80 is shown along a partial portion of the sidewall of masking layer 64, the etch process may generate veils along entirety of the sidewall of the masking layer, in some embodiments. In addition, the etch process may generate veils along the upper surfaces of remaining portions of magnetic layer 62 and masking layer 64. In any case, the generated veils may be removed by changing their composition through the introduction of dopants and subsequent removal of the doped formations. Such a process is described in more detail below in reference to FIGS. 8b and 9b. In other cases, however, the generated veils may not be removed during a subsequent etch process. Since the dopants introduced into the topography may transform the veils into an insulating dielectric layer, shorting problems from the veils may be negated. In such a case, the doped formations may serve to insulate the subsequently formed magnetic cell junction.

Figure 8A:
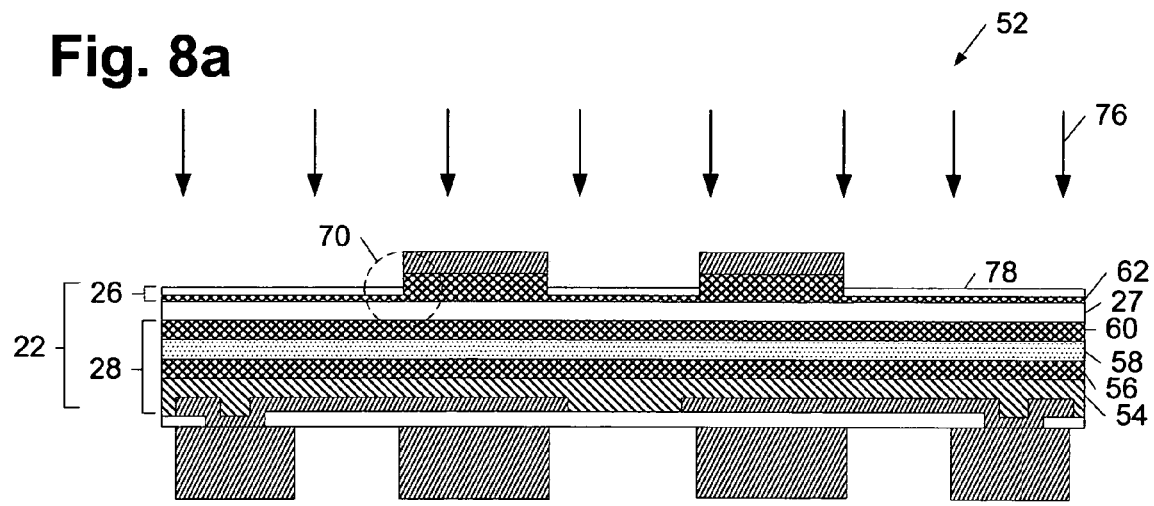

As shown in FIG. 8a, dopants 76 may be introduced into exposed portions of microelectronic topography 20 to form doped portion 78. In a preferred embodiment, the exposed portions of storing portion 26 may be introduced with a low enough concentration and strength of dopants 76 such that the thickness of doped portion 78 is less than the amount of microelectronic topography etched during the subsequent etch process described in reference to FIG. 9a. For example, in some embodiments, the implanting process may include introducing dopants to a depth between approximately 5 angstroms and approximately 50 angstroms of microelectronic topography 20. In other embodiments, dopants may be introduced at larger or smaller depths, depending on the design specifications of the magnetic cell junction fabrication process. In this manner, the amount of topography implanted with dopants may be removed during the subsequent etch step. In some embodiments, the patterning process may be optimized using a ratio of the amount of topography implanted with impurities (as described in reference to FIG. 8a) versus the amount of topography etched (as described in reference to FIG. 9a). For example, in some embodiments, the patterning process described in reference to FIGS. 7a–11 may have an implant to etch ratio between approximately 0.1 and approximately 0.9, or more preferably a ratio of approximately 0.5.

In any case, the implanting step illustrated in FIG. 8a may be conducted with a low-energy and low-concentration source such that the depth of doped region 78 may be limited. For example, in some cases, the step of introducing the dopants 76 may include exposing microelectronic topography 20 to a low or medium density plasma of the one or more impurities introduced into storing portion 26. Alternatively, the step of implanting may include exposing microelectronic topography 20 to a high density plasma of the one or more impurities introduced into storing portion 26. In yet another embodiment, microelectronic topography 20 may be exposed to a gas phase of dopant impurities 68 at room temperature or at an elevated temperature. In some cases, the introduction of dopant impurities 68 may be conducted during an annealing cycle. In any case, the implanting step may include introducing any dopants which may alter the etching and/or electrical characteristics of veil 80 such that the veil may be subsequently removed during a successive etch step-described in reference to FIG. 9a or left on the patterned structure as part of an insulating layer. For example, in some embodiments, the implanting step may include introducing oxygen or nitrogen. Consequently, the method may include oxidizing and/or nitriding microelectronic topography 20, in some embodiments. Other dopant impurities, however, may also or alternatively be implanted, depending on the design specifications of the magnetic cell junction.

Figure 8B:
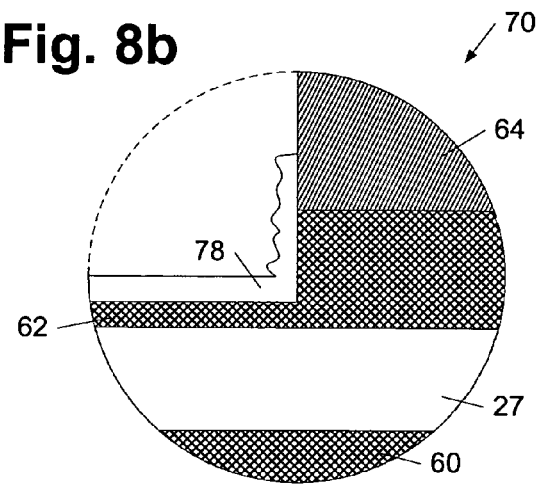

FIG. 8b illustrates a magnified view of portion 70 of microelectronic topography 20 subsequent to the implantation of dopants 76 as described in reference to FIG. 8a. As shown in FIG. 8b, doped portion 78 may include an upper portion of magnetic layer 62 as well as veil 80. As described above, the introduction of dopants used to form doped portion 78 may be adapted to alter the etching characteristics of veil 80 such that it may be subsequently removed during a successive etch step described in reference to FIG. 9a. The introduction of dopents into magnetic layer 62 may form a material which may be removed from the subsequent etch process as well. In some embodiments, the subsequent etch process may be adapted to remove the entirety of doped portion 78 as well as a portion of the underlying layers. As such, FIG. 9a illustrates the removal of doped portion 78 as well as remaining portions of magnetic layer 62 and a portion of tunneling barrier layer 27. Such an etch process may alternatively etch more or less of microelectronic topography 20, depending on the design characteristics of the magnetic cell junction patterning process. For example, in some embodiments, the etch process may primarily remove the doped portion of magnetic layer 62 and underlying layers such that a substantial portion of the doped portion of veil 80 (i.e., the portion of doped portion 78 along the sidewalls of the patterned structure) may remain and serve as an insulating dielectric for the patterned structure.

In any case, the etch process may include any dry or plasma etch process used in the microelectronics fabrication industry. In a preferred embodiment, a high-density fluorine or chlorine based plasma etch process may be used. In some cases, the subsequent etch process may be substantially similar to the etch process described in reference FIG. 7a, while in other embodiments, the two etch processes may be substantially different. In some cases, the step of etching may be characterized for the type of material to be etched during each etch cycle. In particular, the etching method and etch chemistry used for each individual etch process may depend on the composition of the one or more layers to be etched. Although the subsequent etching process described in reference to FIG. 9a removes doped portion 78, the etch process also forms a veil 84 along the sidewalls of magnetic layer 62 and tunneling barrier layer 27, as shown in FIG. 9b. In general, veil 84 may be formed from the redeposition of byproducts of the etch process. In some embodiments, veil 84 may be formed upon the sidewalls of masking layer 64 as well. In a case in which a substantial portion of doped portion of veil 80 is not removed during the etch process, veil 84 may be formed along the sidewalls of the patterned structure and in some embodiments, along the remaining portions of doped portion 78.

In any case, the method may continue with the successive steps of implanting dopants and etching such that generated veils may be removed while the magnetic cell junctions are patterned or left on the structure as part of an insulating dielectric layer. In particular, microelectronic topography 20 may be implanted with dopants 82 to form doped portion 86 as shown in FIG. 10a such that veil 84 may be subsequently removed or left on the structure as part of an insulating dielectric layer. In some cases, such an implanting step may be substantially similar to the implanting step described in reference to FIG. 8a. In particular, the composition and concentration of dopants 82 may be substantially similar to the composition and concentration of dopants 76. In addition, the energy level used to implant dopants 82 may be substantially similar to the energy level used to implant dopants 76. Alternatively, the implantation of dopants 82 may be substantially different from the implantation of dopants 76. In particular, dopants 82 may include one or more different impurities than which are included in dopants 76. In addition or alternatively, dopants 82 may be implanted with a different energy source that what was used to implant dopants 76. In some embodiments, the step of implanting may be characterized for the type of material to be doped during each implanting cycle. In particular, the composition and concentration of dopants, as well as the energy source used for implanting may depend on the layer exposed during the previous etch step.

As stated above, the sequence of steps described in reference to FIGS. 7a–10a may continue through the entirety of plurality of layers 22. In this manner, patterned magnetic cell junctions may be fabricated with such a sequence of steps. In particular, patterned magnetic cell junctions 88 and 90 with storing portions and pinned portions having substantially similar lengths may be fabricated as shown in FIG. 11. In other embodiments, the method may be used to form a magnetic cell junction with a storing portion and a pinned portion having substantially different lengths. Such an embodiment, however, would further include the formation of an additional masking layer in between at least two of the sequence of steps. Since the method includes alternating the steps of etching and implanting, the etch processes conducted subsequent to each of the implanting steps may remove the previously doped veils. Alternatively, the subsequent etch process may be adapted to preferentially remove portions of the topography such that the doped veils remain on the structure as part of an insulating dielectric layer. In either embodiment, the number of metallic veils along the sidewalls of a magnetic cell junction subsequent to the patterning process may be reduced or eliminated relative to a magnetic cell junction patterned using conventional techniques. As a result, the likelihood for forming shorts across the tunneling barrier layer of the patterned magnetic cell junction may be reduced or eliminated using the method described herein.

It will be appreciated to those skilled in the art having the benefit of this disclosure that this invention is believed to provide a method for patterning a magnetic memory cell junction. Further modifications and alternative embodiments of various aspects of the invention will be apparent to those skilled in the art in view of this description. For example, the method described herein may be used for fabricating any type of magnetic memory cell junction, including but not limited to magnetic tunneling junctions (MTJ) and/or giant magnetoresistance (GMR) structures. It is intended that the following claims be interpreted to embrace all such modifications and changes and, accordingly, the drawings and the specification are to be regarded in an illustrative rather than a restrictive sense.

What is claimed is:

1. A method for forming a magnetic memory cell junction, comprising:
   patterning a mask layer above a stack of layers;
   etching exposed portions of the stack of layers;
   terminating the step of etching at a level spaced above a tunneling barrier layer of the stack of layers and below a masked upper surface of a magnetic layer within the stack of layers; and
   implanting dopants into remaining portions of the stack of layers arranged above the tunneling barrier layer.

2. The method of claim 1, wherein the step of etching comprises etching between approximately 20% and approximately 95% of a thickness of the stack of layers arranged above the tunneling barrier layer.

3. The method of claim 1, wherein the step of implanting comprises oxidizing the remaining portions of the stack of layers arranged above the tunneling barrier layer.

4. The method of claim 1, wherein the step of implanting comprises nitriding the remaining portions of the stack of layers arranged above the tunneling barrier layer.

5. The method of claim 1, wherein the step of implanting is adapted to prevent the introduction of dopants into portions of the stack of layers underlying the tunneling barrier layer.

6. The method of claim 1, wherein a different magnetic layer of the stack of layers underlying the tunneling barrier layer comprises a material adapted to prevent the introduction of dopants within the different magnetic layer during the step of implanting.

7. A method for forming a magnetic memory cell junction, comprising:
   patterning a mask layer above a stack of layers comprising a magnetic layer; and
   alternately etching and implanting dopants into exposed portions of the stack of layers, wherein the step of alternately etching and implanting dopants comprises alternately etching and implanting dopants into exposed portions of the magnetic layer.

8. The method of claim 7, wherein the step of alternately etching and implanting comprises:
   generating veils along sidewalls of the patterned stack of layers; and
   implanting dopants into the veils.

9. The method of claim 8, wherein the step of alternately etching and implanting further comprises removing the doped veils.

10. The method of claim 7, wherein the step of alternately etching and implanting comprises etching a greater amount of the stack of layers than the amount of the stack of layers implanted with dopants during the step of implanting.

11. The method of claim 7, wherein the step of alternately etching and implanting comprises oxidizing the exposed portions of the stack of layers.

12. The method of claim 10, wherein the step of alternately etching and implanting further comprises nitriding the exposed portions of the stack of layers.

13. The method of claim 7, wherein the step of alternately etching and implanting is initiated with etching exposed portions of the stack of layers.

14. The method of claim 7, wherein the step of alternately etching and implanting is initiated with implanting dopants into exposed portions of the stack of layers.

15. A method for forming a magnetic memory cell junction, comprising:
    patterning a mask layer above a stack of layers;
    etching exposed portions of the stack of layers in alignment with the mask layer, wherein the step of etching comprises generating veils along sidewalls of the patterned stack of layers;
    implanting dopants into the veils; and
    reiterating the steps of etching and implanting.

16. The method of claim 15, wherein the step of reiterating the step of etching comprises removing doped veils and generating new veils.

17. The method of claim 15, wherein the step of reiterating the step of etching comprises etching a greater amount of the stack of layers than the amount of the stack of layers implanted with dopants during the step of implanting.

18. The method of claim 15, wherein the step of implanting comprises at least one of:
    oxidizing the exposed portions of the stack of layers; and
    nitriding the exposed port ions of the stack of layers.

19. The method of claim 7, wherein the step of alternately etching and implanting further comprises alternately etching and implanting dopants into a tunnel barrier layer of the stack of layers.

20. The method of claim 15, wherein the step of reiterating the steps of etching and implanting comprises repeating the steps of etching and implanting through a first set of one or more magnetic layers, a tunneling barrier layer underlying the first set of magnetic layers, and a second set of one or more magnetic layer underlying the tunneling barrier layer.

* * * * *